United States Patent
Seroussi et al.

(10) Patent No.: US 10,699,721 B2
(45) Date of Patent: Jun. 30, 2020

(54) ENCODING AND DECODING OF DIGITAL AUDIO SIGNALS USING DIFFERENCE DATA

(71) Applicant: DTS, Inc., Calabasas, CA (US)

(72) Inventors: Gadiel Seroussi, Cupertino, CA (US); Pavel Chubarev, Agoura Hills, CA (US); Brandon Smith, Kirkland, WA (US)

(73) Assignee: DTS, Inc., Calabasas, CA (US)

( * ) Notice: Subject to any disclaimer, the term of this patent is extended or adjusted under 35 U.S.C. 154(b) by 219 days.

(21) Appl. No.: 15/939,473

(22) Filed: Mar. 29, 2018

(65) Prior Publication Data

US 2018/0308494 A1   Oct. 25, 2018

Related U.S. Application Data

(60) Provisional application No. 62/489,650, filed on Apr. 25, 2017.

(51) Int. Cl.
  *G10L 19/005* (2013.01)
  *G10L 19/02* (2013.01)
  *H03M 7/30* (2006.01)

(52) U.S. Cl.
  CPC ........ *G10L 19/005* (2013.01); *G10L 19/0204* (2013.01); *H03M 7/3084* (2013.01);
  (Continued)

(58) Field of Classification Search
  CPC . H04L 1/0041; H03M 7/3082; H03M 7/3084; H03M 7/3091; H03M 7/6005;
  (Continued)

(56) References Cited

U.S. PATENT DOCUMENTS

| 5,222,189 A | 6/1993 | Fielder |
| 5,956,674 A | 9/1999 | Smyth et al. |

(Continued)

FOREIGN PATENT DOCUMENTS

WO   2018200384   11/2018

OTHER PUBLICATIONS

US 2002/0013859 A1, 09/2002, Kawahara (withdrawn)
(Continued)

*Primary Examiner* — Angela A Armstrong
(74) *Attorney, Agent, or Firm* — Schwegman Lundberg & Woessner, P.A.

(57) ABSTRACT

An audio encoder can parse a digital audio signal into a plurality of frames, each frame including a specified number of audio samples, perform a transform of the audio samples of each frame to produce a plurality of frequency-domain coefficients for each frame, partition the plurality of frequency-domain coefficients for each frame into a plurality of bands for each frame, each band having bit data that represents a number of bits allocated for the band, and encode the digital audio signal and difference data to a bit stream (e.g., an encoded digital audio signal). The difference data can produce the full bit data when combined with estimate data that can be computed from data present in the bit stream. The difference data can be compressed to a smaller size than the full bit data, which can reduce the space required in the bit stream.

20 Claims, 10 Drawing Sheets

(52) U.S. Cl.
CPC ....... *H03M 7/3091* (2013.01); *H03M 7/6005* (2013.01); *H03M 7/6011* (2013.01); *G10L 19/0212* (2013.01)

(58) Field of Classification Search
CPC .................................................. H03M 7/6011; G10L 19/0204; G10L 19/002; G10L 19/0212; G10L 19/167; G10L 19/00; G10L 19/005
See application file for complete search history.

(56) References Cited

U.S. PATENT DOCUMENTS

| | | | |
|---|---|---|---|
| 2005/0232364 A1* | 10/2005 | Kuroda | H04N 7/52 375/240.25 |
| 2009/0067493 A1* | 3/2009 | Jun | H04N 19/159 375/240.03 |
| 2010/0202558 A1* | 8/2010 | Hargreaves | G10L 19/0204 375/295 |
| 2012/0004918 A1 | 1/2012 | Feng et al. | |
| 2014/0249806 A1* | 9/2014 | Liu | H03M 7/3082 704/206 |

OTHER PUBLICATIONS

"International Application Serial No. PCT US2018 028877, International Preliminary Report on Patentability dated Nov. 7, 2019", 7 pgs.
"International Application Serial No. PCT/US2018/028877, International Search Report dated Jul. 2, 2018", 2 pgs.
"International Application Serial No. PCT/US2018/028877, Written Opinion dated Jul. 2, 2018", 5 pgs.
Golomb, S W, "Run length encodings", IEEE Tran. Inform. Theory, vol. IT-12, (1966), 399-401.
Valin, Jean-Marc, "A High-Quality Speech and Audio Codec with Less Than 10-ms Delay", IEEE Transactions on Audio, Speech, and Language Processing, vol. 18, No. 1., (Jan. 2010), 58-67.

* cited by examiner

ENCODING AND DECODING OF DIGITAL AUDIO SIGNALS USING DIFFERENCE DATA

CROSS-REFERENCE TO RELATED APPLICATION

This application claims the benefit of U.S. Provisional Application No. 62/489,650, filed Apr. 25, 2017, which is incorporated herein by reference in its entirety.

FIELD OF THE DISCLOSURE

The present disclosure relates to encoding or decoding an audio signal.

BACKGROUND OF THE DISCLOSURE

An audio codec can encode a time-domain audio signal into a digital file or digital stream, and decode a digital file or digital stream into a time-domain audio signal. There is ongoing effort to improve audio codecs, such as to reduce the size of an encoded file or stream.

SUMMARY

An example of an encoding system can include: a processor; and a memory device storing instructions executable by the processor, the instructions being executable by the processor to perform a method for encoding an audio signal, the method comprising: receiving a digital audio signal; parsing the digital audio signal into a plurality of frames, each frame including a specified number of audio samples; performing a transform of the audio samples of each frame to produce a plurality of frequency-domain coefficients for each frame; partitioning the plurality of frequency-domain coefficients for each frame into a plurality of bands for each frame; allocating a specified number of bits for each band in each frame; computing a difference value for each band in each frame, the difference value representing a difference between the number of bits allocated for each band in each frame and a corresponding estimated number of bits allocatable for each band in each frame; encoding a bit stream to include: data representing the digital audio signal, and data representing the difference values, but not data directly representing the number of bits allocated for each band in each frame; and outputting the bit stream.

An example of a decoding system can include: a processor; and a memory device storing instructions executable by the processor, the instructions being executable by the processor to perform a method for decoding an encoded audio signal, the method comprising: receiving a bit stream, the bit stream including a plurality of frames, each frame partitioned into a plurality of bands; extracting a quantized norm of each band in each frame; based on the extracted quantized norms, determining an estimated number of bits allocatable for each band in each frame; for each band of each frame, extracting difference values from the bit stream, the difference values representing a difference between a number of bits allocated for each band in each frame and the corresponding estimated number of bits allocatable for each band in each frame; combining the difference values with the corresponding estimated number of bits allocatable for each band in each frame, to determine a number of bits allocated for each band in each frame; allocating the determined number of bits for each band in each frame; and decoding the bit stream using the determined number of bits for each band in each frame to generate a decoded digital audio signal.

Another example of an encoding system can include: a receiver circuit to receive a digital audio signal; a framer circuit to parse the digital audio signal into a plurality of frames, each frame including a specified number of audio samples; a transformer circuit to perform a transform of the audio samples of each frame to produce a plurality of frequency-domain coefficients for each frame; a frequency band partitioner circuit to partition the plurality of frequency-domain coefficients for each frame into a plurality of bands for each frame; a frame bit allocation circuit to allocate a specified number of bits for each band in each frame; a difference calculation circuit to compute a difference value for each band in each frame, the difference value representing a difference between the number of bits allocated for each band in each frame and a corresponding estimated number of bits allocatable for each band in each frame; an encoder circuit to encode a bit stream to include: data representing the digital audio signal, and data representing the difference values, but not data directly representing the number of bits allocated for each band in each frame; and an output circuit to output the bit stream.

BRIEF DESCRIPTION OF THE DRAWINGS

Corresponding reference characters indicate corresponding parts throughout the several views. Elements in the drawings are not necessarily drawn to scale. The configurations shown in the drawings are merely examples, and should not be construed as limiting the scope of the invention in any manner.

DETAILED DESCRIPTION

In an audio encoding and/or decoding system, such as a codec, data representing the number of bits allocated for each band can be encoded as difference data. The difference data can represent a difference from an estimated number of bits allocatable for each band, where the estimated number can be computed from data that is already present in the bit stream (e.g., the encoded digital audio signal). The difference data, combined with the estimate data that is computed from data present in the bit stream, can produce the allocated number of bits for each band. The difference data can be compressed to a smaller size than the full bit data (e.g., explicitly encoding the values of the number of the bits allocated for each band), which can reduce the space required in the bit stream.

Figure 1:
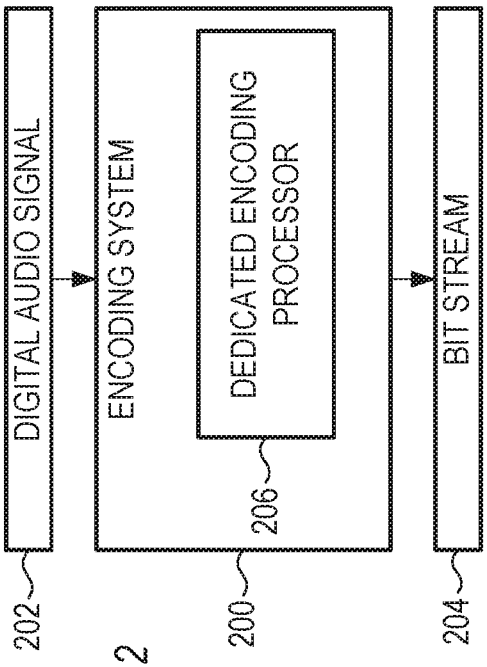
FIG. 1 shows a block diagram of an example of an encoding system, in accordance with some embodiments.

FIG. 1 shows a block diagram of an example of an encoding system 100, in accordance with some embodiments. The configuration of FIG. 1 is but one example of an encoding system; other suitable configurations can also be used.

The encoding system 100 can receive a digital audio signal 102 as input, and can output a bit stream 104. The input and output signals 102, 104 can each include one or more discrete files saved locally or on an accessible server, and/or one or more audio streams generated locally or on an accessible server.

The encoding system 100 can include a processor 106. The encoding system 100 can further include a memory device 108 storing instructions 110 executable by the processor 106. The instructions 110 can be executed by the processor 106 to perform a method for encoding an audio signal. Examples of such a method for encoding an audio signal are explained below in detail.

In the configuration of FIG. 1, the encoding is executed in software, typically by a processor that can also perform additional tasks in a computing device. As an alternative, the encoding can also be performed in hardware, such as by a dedicated chip or dedicated processor that is hard-wired to perform the encoding. An example of such a hardware-based encoder is shown in FIG. 2.

Figure 2:
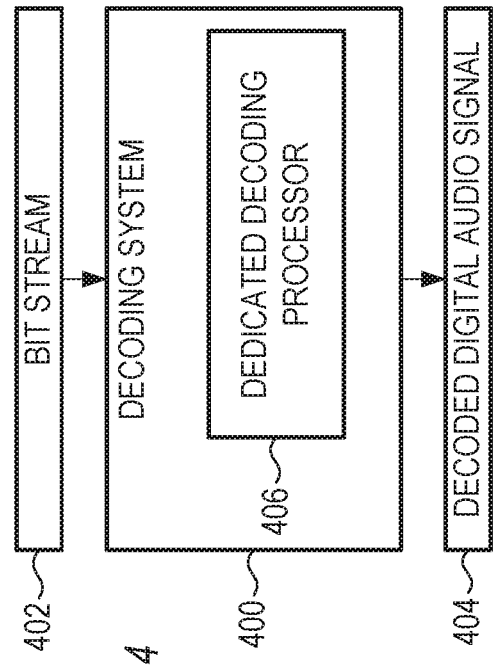
FIG. 2 shows a block diagram of another example of an encoding system, in accordance with some embodiments.

FIG. 2 shows a block diagram of another example of an encoding system 200, in accordance with some embodiments. The configuration of FIG. 2 is but one example of an encoding system; other suitable configurations can also be used.

The encoding system 200 can receive a digital audio signal 202 as input, and can output a bit stream 204. The encoding system 200 can include a dedicated encoding processor 206, which can include a chip that is hard-wired to perform a particular encoding method. Examples of such a method for encoding an audio signal are explained below in detail.

Figure 3:
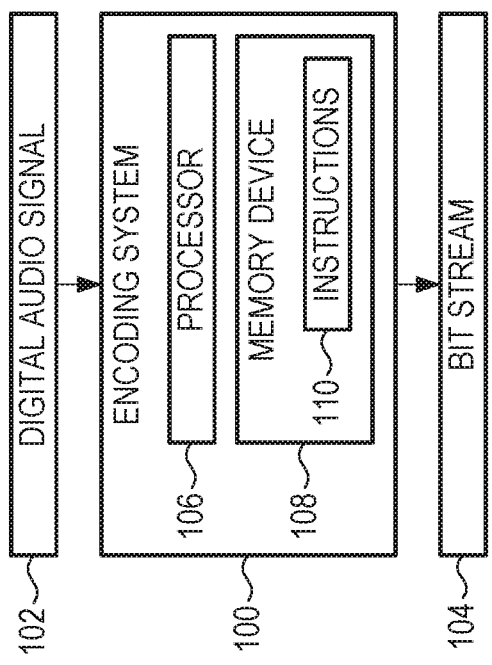
FIG. 3 shows a block diagram of an example of a decoding system, in accordance with some embodiments.
Figure 4:
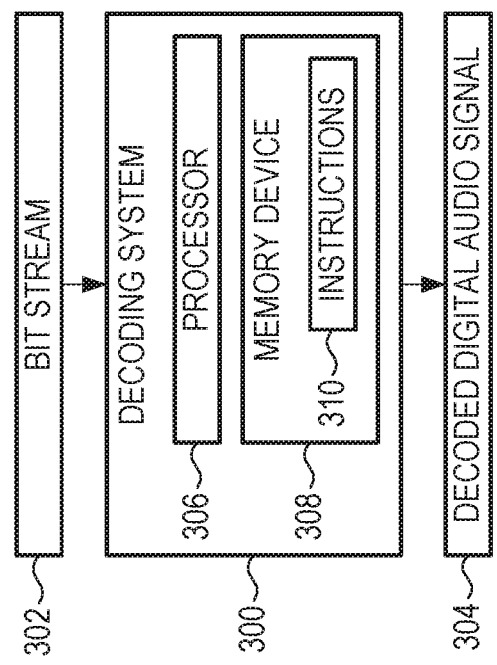
FIG. 4 shows a block diagram of another example of a decoding system, in accordance with some embodiments.

The examples of FIGS. 1 and 2 show encoding systems that can operate in software and in hardware, respectively. In some examples, the encoding system can use a combination of software and hardware. FIGS. 3 and 4 below show comparable decode systems that can operate in software and in hardware, respectively. Similarly, the decoding system can also use a combination of software and hardware.

FIG. 3 shows a block diagram of an example of a decoding system, in accordance with some embodiments. The configuration of FIG. 3 is but one example of a decoding system; other suitable configurations can also be used.

The decoding system 300 can receive a bit stream 302 as input, and can output a decoded digital audio signal 304. The input and output signals 302, 304 can each include one or more discrete files saved locally or on an accessible server, and/or one or more audio streams generated locally or on an accessible server.

The decoding system 300 can include a processor 306. The decoding system 300 can further include a memory device 308 storing instructions 310 executable by the processor 306. The instructions 310 can be executed by the processor 306 to perform a method for decoding an audio signal. Examples of such a method for decoding an audio signal are explained below in detail.

In the configuration of FIG. 3, the decoding is executed in software, typically by a processor that can also perform additional tasks in a computing device. As an alternative, the decoding can also be performed in hardware, such as by a dedicated chip or dedicated processor that is hard-wired to perform the encoding. An example of such a hardware-based decoder is shown in FIG. 4.

FIG. 4 shows a block diagram of another example of a decoding system 400, in accordance with some embodiments. The configuration of FIG. 4 is but one example of a decoding system; other suitable configurations can also be used.

The decoding system 400 can receive a bit stream 402 as input, and can output a decoded digital audio signal 404. The decoding system 400 can include a dedicated decoding processor 406, which can include a chip that is hard-wired to perform a particular decoding method. Examples of such a method for decoding an audio signal are explained below in detail.

Figure 5:
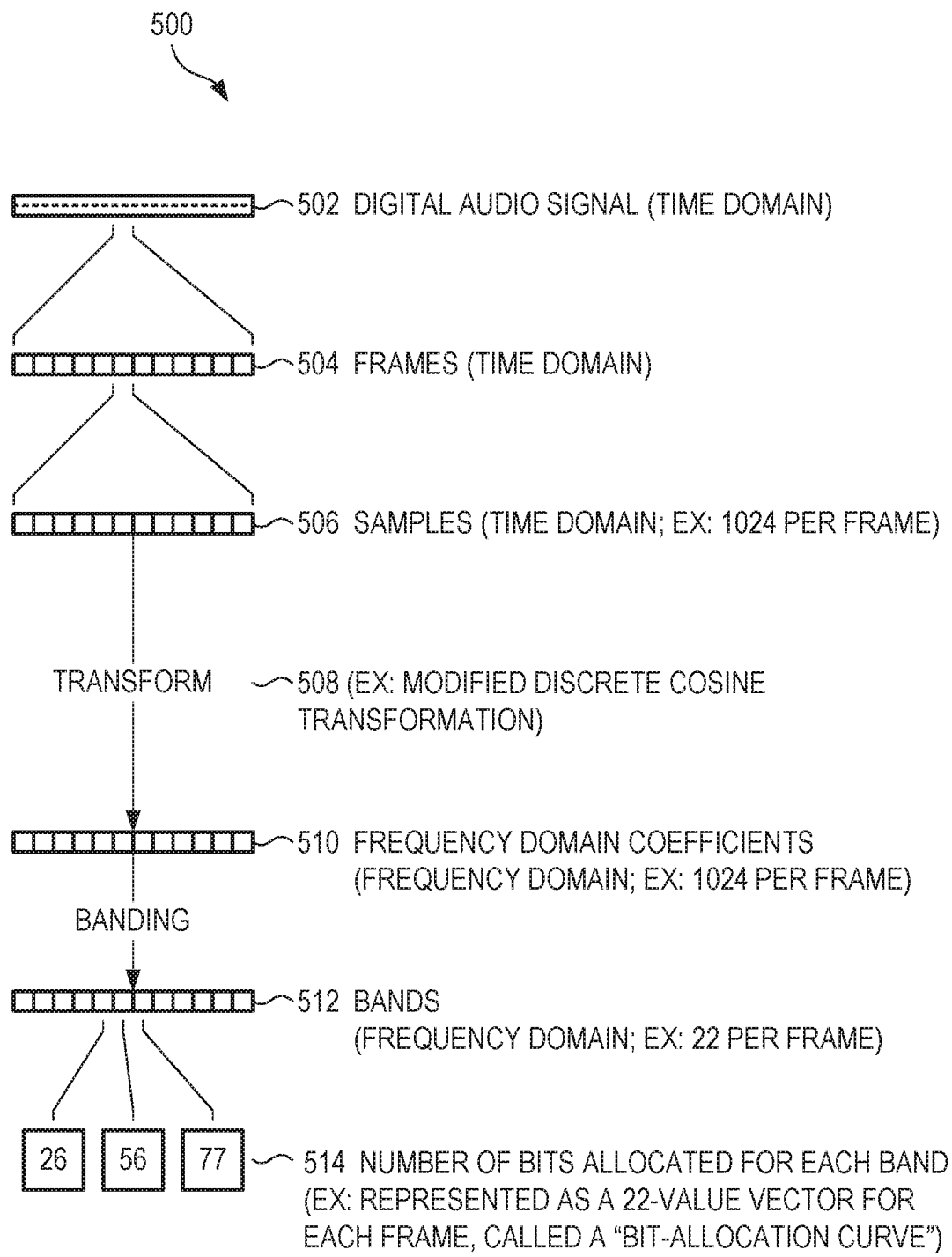
FIG. 5 shows several of the quantities involved with encoding a digital audio signal, in accordance with some embodiments.

FIG. 5 shows several of the quantities involved with encoding a digital audio signal, in accordance with some embodiments. Decoding a bit stream generally involves the same quantities as encoding the bit stream, but with mathematical operations performed in reverse. The quantities shown in FIG. 5 are but examples of such quantities; other suitable quantities can also be used. Each of the quantities shown in FIG. 5 can be used with any of the encoders or decoders shown in FIGS. 1-4.

The encoder can receive a digital audio signal 502. The digital audio signal 502 is in the time domain, and can include a sequence of integers or floating point numbers that represent an evolving amplitude of an audio signal over time. The digital audio signal 502 can be in the form of a stream (e.g., no specified beginning and/or end), such as a live feed from a studio. Alternatively, the digital audio signal 502 can be a discrete file (e.g., having a beginning and an end, and a specified duration), such as an audio file on a server, an uncompressed audio file ripped from a compact disc, or a mixdown file of a song in an uncompressed format.

The encoder can parse the digital audio signal 502 into a plurality of frames 504, where each frame 504 includes a specified number of audio samples 506. For example, a frame 504 can include 1024 samples 506, or another suitable value. In general, grouping the digital audio signal 502 into frames 504 allows an encoder to apply its processing efficiently to a well-defined number of samples 506. In some examples, such processing can vary frame-to-frame, so that each frame can be processed independently of the other frames. In other examples, processing can include sample data from adjacent frames.

The encoder can perform a transform 508 of the audio samples 506 of each frame 504. In some examples, the transform can be a modified discrete cosine transformation. Other suitable transforms can be used, such as Discrete Short-Time Fourier Transform, and others. The transform 508 converts time-domain quantities, such as the samples 506 in a frame 504, into frequency-domain quantities, such as the frequency-domain coefficients 510 for the frame 504. The transform 508 can produce a plurality of frequency-domain coefficients 510 for each frame 504. The frequency-domain coefficients 510 describe how much signal of a particular frequency is present in the frame.

In some examples, the number of frequency domain coefficients 510 produced by a transform 508 can equal the number of samples 506 in a frame, such as 1024. In some examples, there may be overlap in time-domain frames. For example, to compute a modified discrete cosine transformation, the time domain frame can use a total of 2048 samples, with 1024 of the 2048 samples being from neighboring frames. For this specific example, the frame size can be considered to be 1024 samples, even though the transform can use 1024 additional samples from neighboring frames.

The encoder can partition the plurality of frequency-domain coefficients 510 for each frame 504 into a plurality of bands 512 for each frame 504. In some examples, there can be twenty-two bands 512 per frame 504, although other values can also be used. Each band 512 can represent a range of frequencies 510 in the frame 504, so that the concatenation of all the frequency ranges includes all the frequencies represented in the frame 504.

A general goal of a codec is to best represent a source signal given a limited data size. The data size can be expressed as a particular data rate or bit rate of the encoded file. For example, data rates can include 1411 kbps (kilobits per second), 320 kbps, 256 kbps, 192 kbps, 160 kbps, 128 kbps, or another values. In general, the higher the data rate, the more accurate the representation of the frame.

The encoder can allocate a specified number of bits 514 for each band in each frame. In some examples, for bands in which there is a relatively large amount of frequency content, the encoder can allocate a relatively high number of bits to represent the frequency content. For bands in which there is relatively little frequency content, the encoder can allocate a relatively small number of bits to represent the frequency content. In general, the higher the number of bits allocated for a particular band, the more accurate the representation of the frequencies in that particular band. The encoder can strike a balance between accuracy, which drives the bit allocation upward, and data rate, which can provide an upper limit to the number of bits allocated per frame.

The number of bits 514 allocated for each band in a particular frame can be represented as a vector of integers, which can be referred to as a bit-allocation curve. In some examples, in which there are twenty-two bands 512 per frame 504, the bit-allocation curve for each frame 504 can be a twenty-two-value vector.

In order for a decoder to properly decode a bit stream, the decoder should extract the bit-allocation curve for each frame from the bit stream. For this reason, the encoder should ensure that the information in the bit-allocation curve is included in the bit stream.

One possibility is that the encoder encodes the bit-allocation curve for each frame along with audio information with each frame. Specifically, the encoder can encode a bit stream to include data directly representing the number of bits allocated for each band in each frame. For examples in which there are twenty-two bands per frame, the encoder can encode the full twenty-two-value vector of integers for a particular frame within, adjacent to, or near the audio data for the particular frame.

Figure 6:
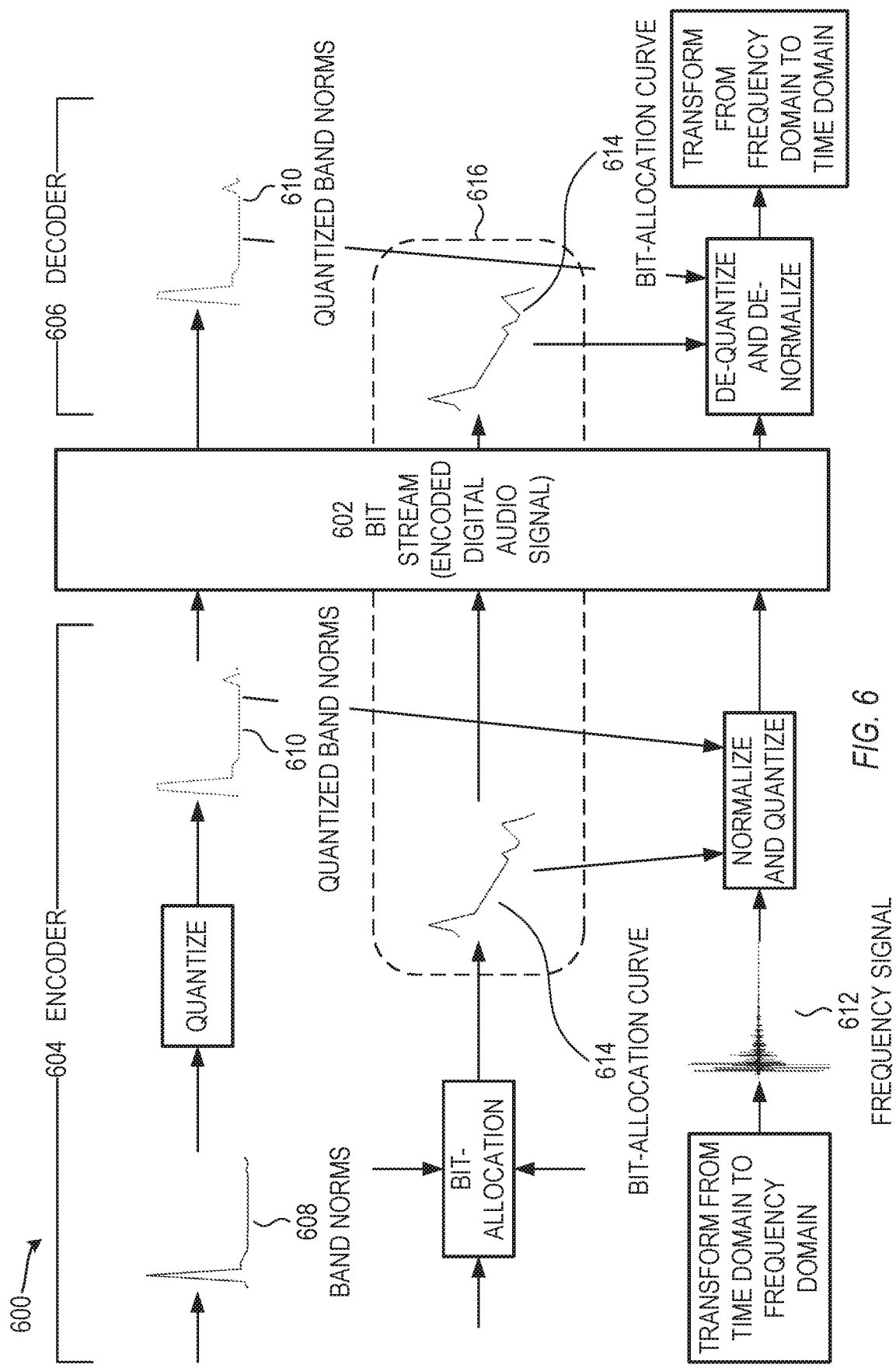
FIG. 6 shows a block diagram of an example of an encoding/decoding system, in accordance with some embodiments.

A drawback to directly encoding the bit-allocation curve is that doing so can take up a relatively large amount of space in the bit stream. For examples in which there are twenty-two bands per frame, the twenty-two integers for each frame can take up space in the bit stream that could otherwise be used to code the audio signal. An example of such an encoding and decoding system is shown in FIG. 6.

An improvement over directly encoding the bit-allocation curve is instead encoding difference data into the bit stream, without directly encoding the full bit data of the bit-allocation curve. The difference data can produce the full bit data when combined with estimate data that is computed from data that is already present in the hit stream. The difference data can be compressed to a smaller size than the full bit data, which can reduce the space required in the bit stream. In some examples, the difference data can represent a vector that includes several zero values, which can be compressed efficiently. Example of these improved encoding and decoding systems are shown in FIGS. 7-10.

The estimate data can be formed from data that is already present in the bit stream. In some examples, the estimate data can be obtained from computed quantized norms of each band of each frame. The quantized norms can be encoded directly in the bit stream, and can be used to compute rough estimates for the number of bits allocatable for each band in each frame. Each quantized norm can have a value derived from frequency-domain coefficients in the band and quantized to equal one of a plurality of specified values, as detailed below.

In some examples, the estimate data can further include one or more parameters that can be encoded into the bit stream.

In some examples, the parameters can be of a structure different from the multi-valued vector of the bit-allocation curve. For example, a slope can be a single scalar value. One example of a suitable parameter can include a slope (in units of bits) versus frequency, over the bands in a particular frame.

In some examples, one of the parameters can include a reference bit-allocation curve, which can be encoded directly into the bit stream, and can serve as an estimate for multiple frames. For these examples, a single reference bit-allocation curve, combined one-at-a-time with multiple difference values, can produce multiple bit-allocation curves that apply to multiple frames in the digital audio signal. Encoding one bit-allocation curve (or one bit-allocation curve for a given time period in the digital audio signal) can use less space than encoding a bit-allocation curve for each frame.

The following paragraphs provide a detailed example of how to compute the various quantities shown in FIG. 5. The computations can be executed by any of the processors shown in FIGS. 1-4, or by another suitable processor. This is but one example; other suitable computations can also be performed.

The encoder can encode a bit stream (e.g., a digital audio signal) as follows.

Divide the input signal into frames, each frame containing a fixed number of audio samples. In some examples, the audio samples are contiguous. In some examples, downstream processing for a frame can optionally use samples from neighboring frames.

Assign to each frame a bit budget C, which is the number of bits that can be used to describe the frame. This bit budget can be derived at least in part from the overall prescribed bit rate, optionally with additional considerations, such as an indicator of a relative importance of the frame.

For each frame, apply a transform to transform the audio samples to a frequency domain. A suitable transform can include a modified discrete cosine transformation, although other transforms can also be used. From the transform, form a vector X of coefficients $x_i$, according to:

$$X=[x_0, x_1, \ldots, x_{n-1}],$$

where each coefficient $x_i$ represents the strength of the digital audio signal at a particular frequency.

For each frame, partition the vector X into M bands $B_i$, according to:

$$B_0, B_1, \ldots, B_{M-1}.$$

Each band $B_i$ includes a subsequence of $N_i$ coefficients from X, such as:

$$B_i = [x_{k_i}, x_{k_i+1}, \ldots, x_{k_i+N_i+1}].$$

where $k_i$ is a starting coordinate of band $B_i$, with a length of $N_i$.

Compute a Euclidean (or $L_2$) norm $w_i$ of each band $B_i$, according to:

$$w_i = \sqrt{\sum_{j=0}^{N_i-1} x_{k_i+j}^2}$$

Form a vector w of norms $w_i$, according to:

$$w = [w_0, w_1, \ldots, w_{M-1}].$$

Quantize each norm $w_i$ into an approximation $\bar{w}_i$, and encode the following vector into the bit stream:

$$\bar{w} = [\bar{w}_0, \bar{w}_1, \ldots, \bar{w}_{M-1}].$$

Distribute the remaining bit budget C' across the bands, assigning $c_i$ bits to band $B_i$, where $i=0, 1, \ldots, M-1$, according to:

$$\sum_{i=0}^{M-1} c_i \leq C'.$$

Form a bit allocation vector c, according to:

$$c = [c_0, c_1, \ldots, c_{M-1}].$$

As discussed above, it takes a relatively large amount of space to write the bit allocation vector c directly into the bit stream. As an improvement over writing the bit allocation vector c directly into the bit stream, instead write data representing a difference vector $\Delta c$. This is explained in detail below, following a summary of the decoder methodology.

For each band $B_i$, compute the normalized band $\tilde{B}_i$, according to:

$$\tilde{B}_i = \frac{1}{w_i}[x_{k_i}, x_{k_i+1}, \ldots, x_{k_i+N_i-1}].$$

Quantize each normalized band $\tilde{B}_i$ into a quantized normalized band $\bar{B}_i$.

Encode each quantized normalized band $\bar{B}_i$ into the bit stream, using at most $c_i$ bits to describe the quantized normalized band $\bar{B}_i$ The decoder can decode the digital audio signal in a similar sequence, reversing the sequence of the encoder.

Read and decode the quantized band norms $\bar{w}_i$.

As discussed above, because the bit allocation vector $c=[c_0, c_1, \ldots, c_{M-1}]$ may not be written directly into the bit stream, the decoder cannot read the bit allocation vector c directly from the bit stream. Instead, the decoder can read the difference vector $\Delta c$ from the bit stream, and compute the bit allocation vector c from the difference vector $\Delta c$, as explained below, following completion of the decoder summary.

Read and decode the quantized normalized bands $\bar{B}_i$.

Reconstruct the unnormalized bands $B'_i$, according to:

$$B'_i = \bar{w}_i \bar{B}_i.$$

Concatenate the reconstructed bands $B'_i$ to reconstruct the frequency domain representation X', according to:

$$X' = [x'_0, x'_1, \ldots, x'_{n-1}],$$

Apply an inverse transform to the frequency domain representation X' to obtain the reconstructed audio samples for the frame.

As explained above, the encoder allocates bits within the frames such that parts of the audio signal that are perceptually important are allocated more bits, while parts that may be less perceptible (e.g., due to masking phenomena) can be encoded using fewer bits. To determine the bit allocations (referred to as the bit-allocation curve), the encoder can use all available information, such as the unquantized spectral representation X, the unquantized band norms $w_i$, details regarding each band's internal compositions, and so forth. This information may not be available to the decoder. The decoder should know how many bits were allocated for each band before decoding and reconstructing the normalized bands $\bar{B}_i$. Consequently, the decoder needs a way to precisely reconstruct the bit allocation vector c, because the bit allocation vector c may not be written directly into the bit stream.

Because the encoded description or representation of the bit-allocation curve is part of the compressed bit stream, it can eat into the bit budget available to describe the normalized bands. The encoder can account for the cost of describing the bit allocation vector c when determining the values $c_i$ themselves. Thus, the description of the bit allocation vector c can affect the quality of the reconstructed audio. It is desirable that the description be as efficient as possible, and that the description take up the fewest possible number of bits.

Because encoding the bit allocation vector c directly into the bit stream can take up more bits than necessary, the techniques discussed herein can use information that is already encoded into the bit stream. Specifically, because the quantized norms $\bar{w}_i$ are encoded into the bit stream independent of a description of the bit allocation, the encoder and decoder can use the quantized norms $\bar{w}_i$ to estimate the bit allocation. Using the quantized norms $\bar{w}_i$ as an estimate is essentially free, because the quantized norms $\bar{w}_i$ are already present in the bit stream.

The decoder can try to mimic the computation of the bit allocations by the encoder, using quantized band norms $\bar{w}_i$ in place of the actual band norms $w_i$. The decoder can ignore the effects of other information available to the encoder. This can result in an estimated hit allocation $c' = [c'_0, c'_1, \ldots, c'_{M-1}]$, which can serve as a rough approximation of the true bit allocation c.

Because all the information that is available to the decoder is also available to the encoder, the encoder can generate the estimated bit allocation c'. The encoder can describe the true bit allocation c by forming a difference vector $\Delta c$, according to:

$$\Delta c = c - c' = [c_0 - c'_0, c_1 - c'_1, \ldots, c_{M-1} - c'_{M-1}]$$

To summarize, the encoder can compute the bit allocation vector c using the actual hand norm vector w and other information, can compute the estimated bit allocation vector c' using only the quantized band norm vector $\bar{w}$, and can compute, encode, and write the difference vector $\Delta c = c - c'$ into the hit stream. Likewise, the decoder can compute the estimated hit allocation vector c' using only the quantized band norm vector $\bar{w}$, can read and decode the difference vector $\Delta c = c - c'$ from the bit stream, and can compute the bit allocation vector c from a sum of the estimated bit allocation vector c' and the difference vector $\Delta c$.

If the estimated bit allocation vector c' is similar to the actual bit allocation vector c, then encoding the difference vector Δc may take significantly fewer bits than encoding bit allocation vector c. This savings in bits arises because many entries in the difference vector Δc can be zero or other relatively small integers. The encoder and decoder can employ a code that uses shorter code words for small magnitude integers, and longer code words for larger magnitude integers, which can achieve significant compression on the difference vector Δc.

An example of such a code is a Golomb code. A Golomb code can encode integers as strings of zeros and ones. For example, the Golomb code can encode a value of 0 as a string 01, a value of −1 as a string 11, a value of +1 as a string 01, a value of −2 as a string 101, a value of +2 as a string 0001, a value of −3 as a string 1001, a value of +3 as a string 00001, and so forth. Other suitable codes can also be used.

To summarize, the encoder can compute the bit allocation vector c using the actual band norm vector w and other information, and can compute the estimated bit allocation vector c' using only the quantized band norm vector. The encoder can then compute, encode, and write the difference vector Δc=c−c' into the bit stream. Likewise, the decoder can compute the estimated bit allocation vector c' using only the quantized band norm vector $\bar{w}$, and can read and decode the difference vector Δc=c−c' from the bit stream. The decoder can then compute the bit allocation vector c from a sum of the estimated bit allocation vector c' and the difference vector Δc. In some examples, the encoder can use shorter encodings when the entries of the difference vector Δc are small integers, and longer encodings when they are larger integers. In some examples, a difference vector Δc with all zero entries can be encoded using just one bit.

As an optional alternative, the encoder and decoder can use a parametrized description of the bit allocation vector c. For example, instead of encoding the bit allocation vector c explicitly, the encoder can derive and describe a vector of parameters $p=[p_0, p_1, \ldots p_{l-1}]$. The encoder and decoder can derive the bit allocation vector c from the parameters p through deterministic computation. For these examples, the encoder can compute an estimated parameter vector $p'=[p'_0, p'_1, \ldots, p'_{l-1}]$, using only the quantized band norm vector $\bar{w}$, and ignoring other information that is available only to the encoder and not the decoder. The encoder can then form a difference vector as Δp=p−p'. The encoder can encode and write the difference vector Δp into the bit stream. The decoder can decode the difference vector Δp from the bit stream. The decoder can compute the parameters p from a sum of the estimated parameter vector p' and the difference vector Δp.

FIG. 6 shows a block diagram of an example of an encoding/decoding system 600, in accordance with some embodiments. As will be discussed below, the encoding/decoding system of FIG. 6 can include an inefficiency at region 616. This inefficiency is remedied in the configurations discussed below and shown in FIGS. 7-10.

The system 600 is centered around a bit stream 602. The encoder 604 can use any information it has, from any available sources, to encode the digital audio signal into the bit stream 602. The decoder 606 is typically detached from the encoder 604, and can only use information stored in the bit stream 602 to decode the digital audio signal. As a result, the encoder 604 must ensure that the bit stream 602 has all the information it needs for the decoder 606 to decode the digital audio signal properly.

The encoder 604 can produce band norms 608. Each band norm 608 can have a value derived from frequency-domain coefficients in the band. The encoder 604 can quantize the band norms 608 to produce quantized band norms 610. Each band norm can be quantized to equal one of a plurality of specified values. The encoder 604 can write data representing the quantized band norms 610 into the bit stream 602. The decoder 606 can extract the quantized band norms from the bit stream 602.

The encoder 604 can allocate bits for each band, for each frame. In performing the allocating, the encoder can use information from any available sources, optionally including the band norms 608, and optionally including a frequency signal 612 that represents a portion of the digital audio signal. The encoder can form a bit-allocation curve 614 for a particular frame, which represents how many bits are allocated for each band in the particular frame.

In the configuration of FIG. 6, the encoder 604 can write data directly representing the bit-allocation curve 614 into the bit stream 602, and the decoder 606 can extract the bit-allocation curve 614 directly from the bit stream 602. As discussed above, storing the bit-allocation curve 614 directly in the bit stream 602 can be inefficient. This inefficiency is shown as region 616 in FIG. 6. The system configurations shown in FIGS. 7-10 can remedy this inefficiency.

The encoder 604 can normalize and quantize the frequency signal 612 and write data representing the frequency signal 612 into the bit stream 602. The decoder 606 can read the normalized and quantized frequency data from the bit stream 602. The decoder 606 can then de-quantize and de-normalize the frequency data, then perform an inverse transform to convert the frequency data to time-domain audio data.

Figure 7:
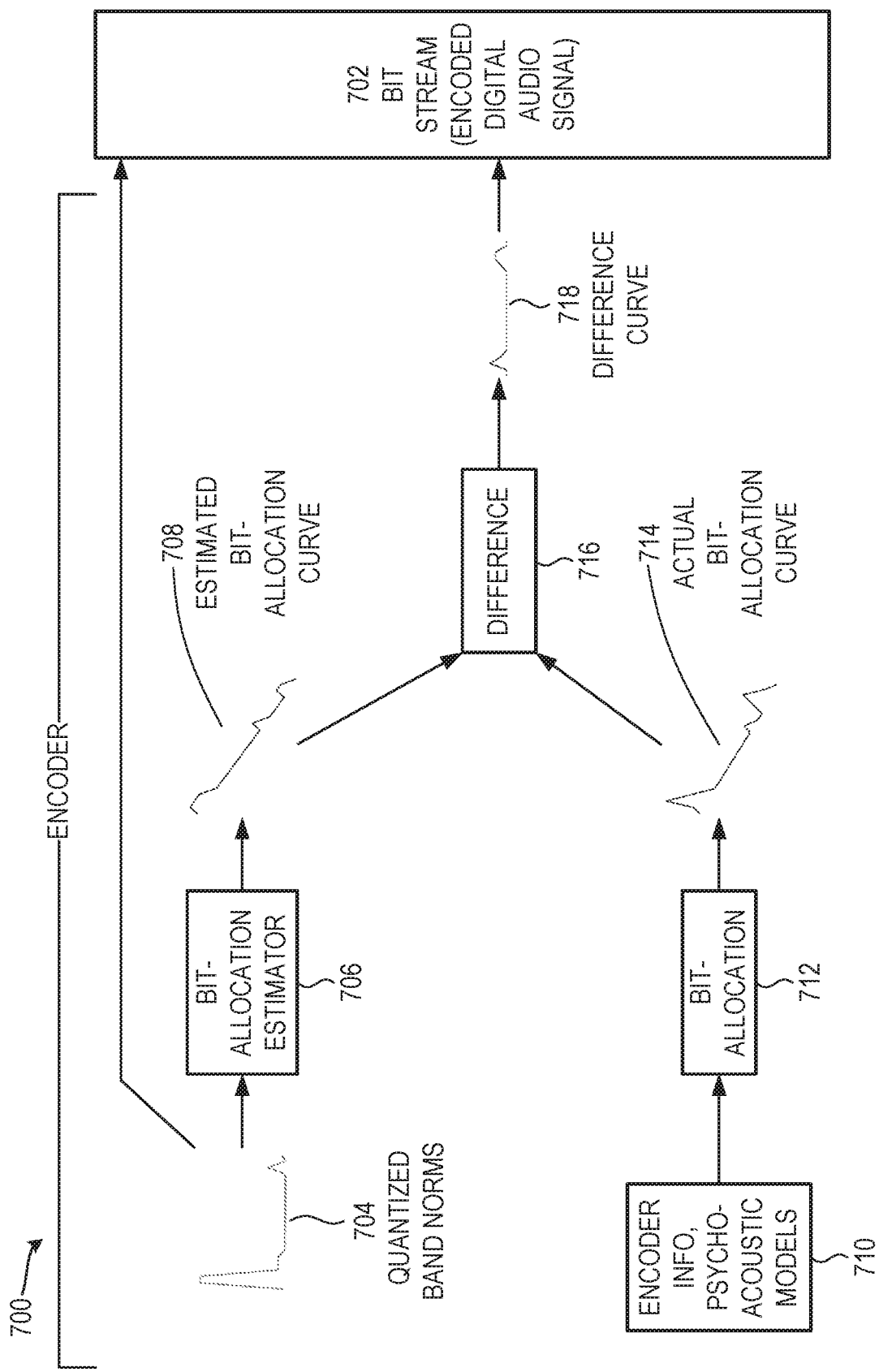
FIG. 7 shows a block diagram of an example of an encoder, in accordance with some embodiments.

FIG. 7 shows a block diagram of an example of an encoder 700, in accordance with some embodiments. This encoder 700, and its corresponding decoder (FIG. 8) can remedy the inefficiency of the system of FIG. 6.

The encoder 700 can form the quantized band norms 704 as described above, and can write data representing the quantized band norms 704 to the bit stream 702, also as described above. Further, the encoder 700 can apply a bit-allocation estimator 706 to form an estimated bit-allocation curve 708. Note that the decoder (FIG. 8) can apply the same bit-allocation estimator to the quantized band norms, and can therefore reproduce exactly the estimated bit-allocation curve 708 solely from reading the bit stream 702.

The encoder 700 can employ data from any available sources 710, including psychoacoustic models and others, and perform bit-allocation 712 to produce a bit-allocation curve 714. In FIG. 7, the bit-allocation curve 714 is referred to as an "actual" bit-allocation curve, because this is the curve that the encoder actually applies to the bands in the frame.

The encoder can compute a difference 716 between the actual bit-allocation curve 714 and the estimated bit-allocation curve 708, to form a difference curve 718. As discussed above, the difference curve 718 can include many zeros or relatively small integers, which can be more efficiently coded (e.g., occupying less space in the bit stream) than a direct representation of the actual bit-allocation curve 714.

Figure 8:
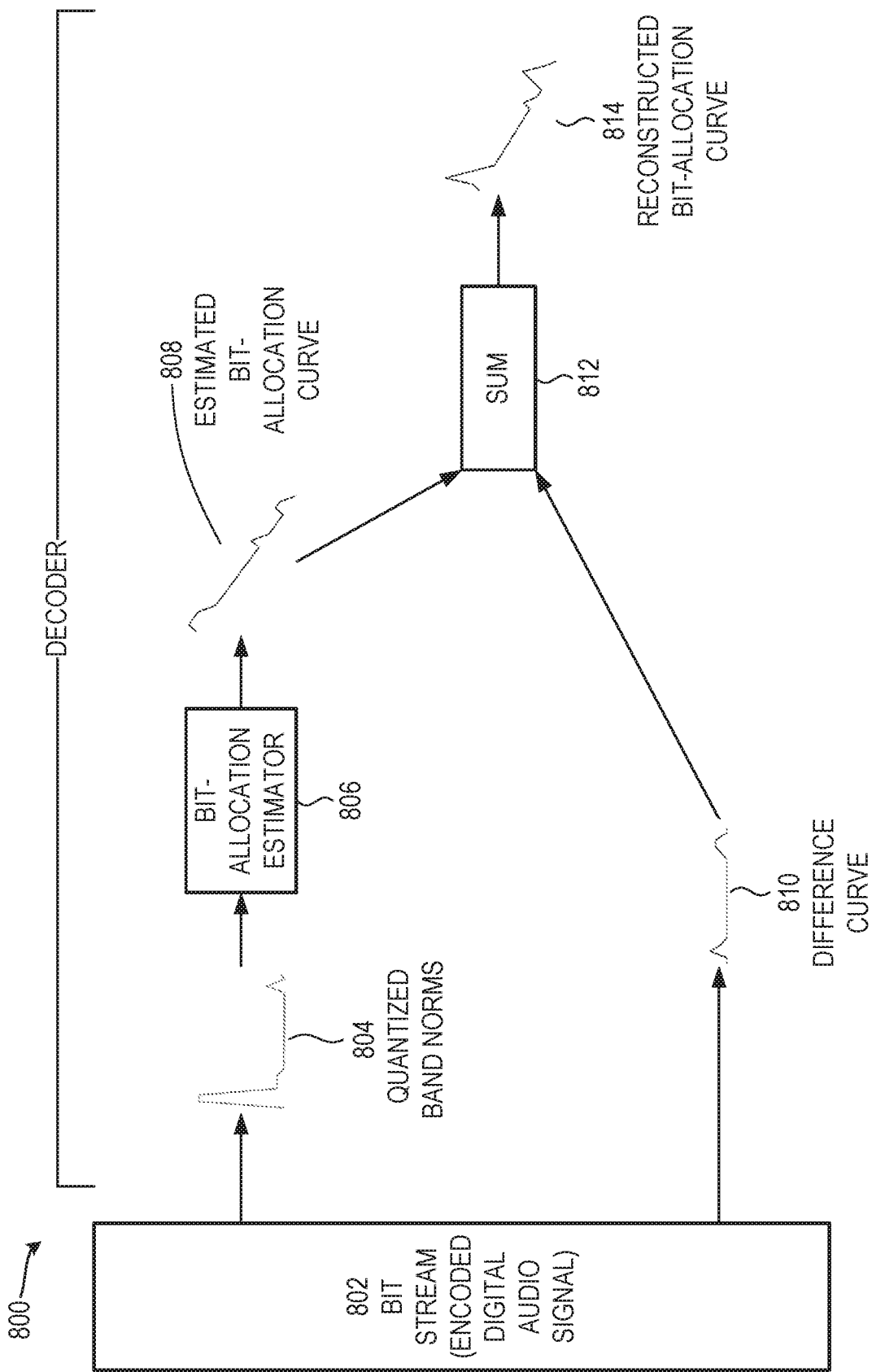
FIG. 8 shows a block diagram of another example of a decoder, in accordance with some embodiments.

FIG. 8 shows a block diagram of another example of a decoder 800, in accordance with some embodiments. This decoder 800, and its corresponding encoder (FIG. 7) can remedy the inefficiency of the system of FIG. 6.

The decoder 800 can extract the quantized band norms 804 from the bit stream 802, can employ the same bit-allocation estimator 806 as used in the encoder (element 706 in FIG. 7), and can therefore exactly reproduce the same estimated bit-allocation curve 808 as used in the encoder (element 708 in FIG. 7).

The decoder 800 can extract the difference curve 810 from the bit stream 802. The decoder 800 can then sum 812 the estimated bit-allocation curve 808 and the difference curve 810 to form a reconstructed bit-allocation curve 814 that exactly matches the actual bit-allocation curve 714 used by the encoder 700 (FIG. 7).

The difference curve (718 in FIG. 7, and 810 in FIG. 8) can correspond to corrections in numerical value to the bit-allocation curve. For example, if the bit-allocation curve is a vector of twenty-two integers, then the difference curve (prior to compression) can also be a vector of twenty-two integers.

As an alternative, which can be used instead of or in addition to the difference curve of FIGS. 7-8, the encoder and decoder can use estimated adjustments, which can include one or more parameters that can each affect multiple bands in a frame. An example of a parameter can be a slope, in units of bits per frequency unit. Such a slope can impart a particular number of bits to a band, where the number of bits can vary from band-to-band as a function of frequency. Other suitable parameters can also be used.

Figure 9:
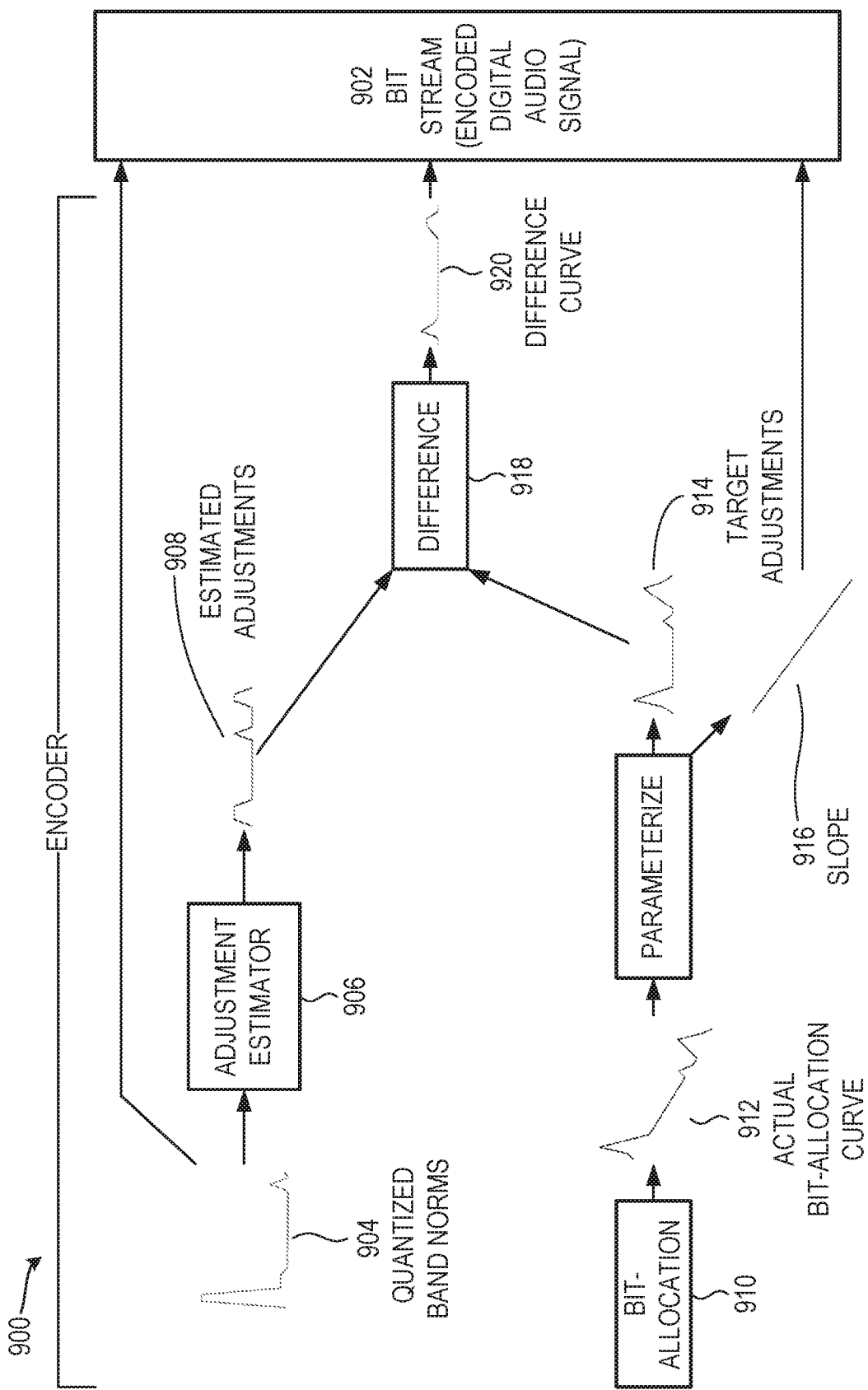
FIG. 9 shows a block diagram of another example of an encoder, in accordance with some embodiments.

FIG. 9 shows a block diagram of another example of an encoder 900, in accordance with some embodiments. This encoder 900, and its corresponding decoder (FIG. 10) can remedy the inefficiency of the system of FIG. 6.

The encoder 900 can form the quantized band norms 904 as described above, and can write data representing the quantized band norms 904 to the bit stream 902, also as described above. Further, the encoder 900 can apply an adjustment estimator 906 to form estimated adjustments 908. Note that the decoder (FIG. 10) can apply the same adjustment estimator to the quantized band norms, and can therefore reproduce exactly the estimated adjustments 908 solely from reading the bit stream 902.

The encoder 900 can perform bit-allocation 910 to create an "actual" bit-allocation curve 912, as discussed above. The encoder 900 can additionally parametrize the actual bit-allocation curve 912 to form target (e.g., desired) adjustments 914 and/or a slope 916. The encoder 900 can write data representing the slope 916 and/or the target adjustments to the bit stream 902. The encoder 900 can take a difference 918 between the target adjustments 914 and the estimated adjustments 908 to form a difference curve 920. The encoder 900 can write data representing the difference curve 920 to the bit stream.

Figure 10:
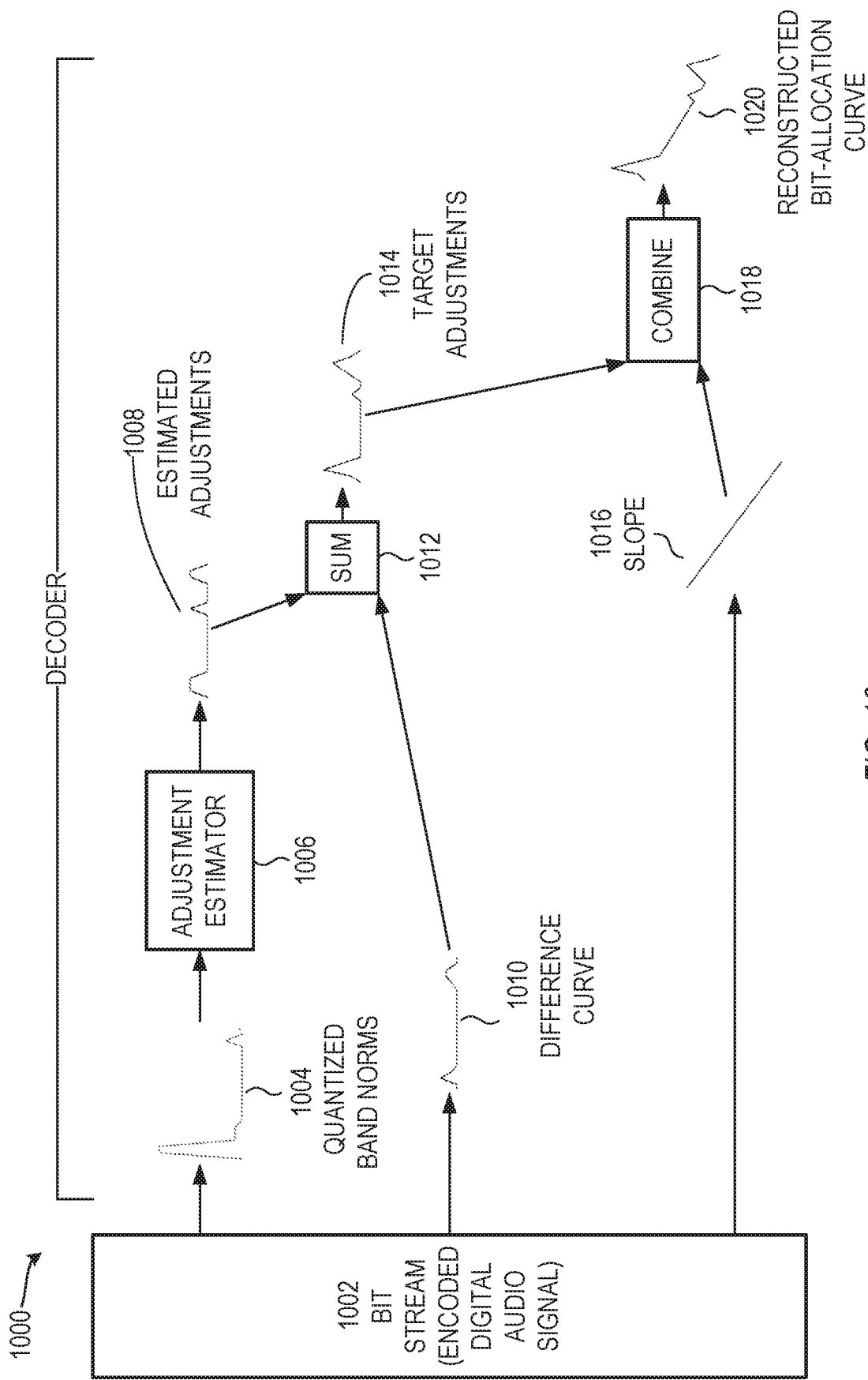
FIG. 10 shows a block diagram of another example of a decoder, in accordance with some embodiments.

FIG. 10 shows a block diagram of another example of a decoder 1000, in accordance with some embodiments. This decoder 1000, and its corresponding encoder (FIG. 9) can remedy the inefficiency of the system of FIG. 6.

The decoder 1000 can extract the quantized band norms 1004 from the bit stream 1002, can employ the same adjustment estimator 1006 as used in the encoder (element 906 in FIG. 9), and can therefore exactly reproduce the same estimated adjustments 1008 as used in the encoder (element 908 in FIG. 9).

The decoder 1000 can extract the difference curve 1010 from the bit stream 1002. The decoder 1000 can then sum 1012 the estimated adjustments 1008 and the difference curve 1010 to form target adjustments 1014. The decoder 1000 can extract the slope 1016 from the bit stream 1002, combine 1018 the slope 1016 with the target adjustments 1014 to form a reconstructed bit-allocation curve 1020 that exactly matches the actual bit-allocation curve 912 used by the encoder 900 (FIG. 9).

Figure 11:
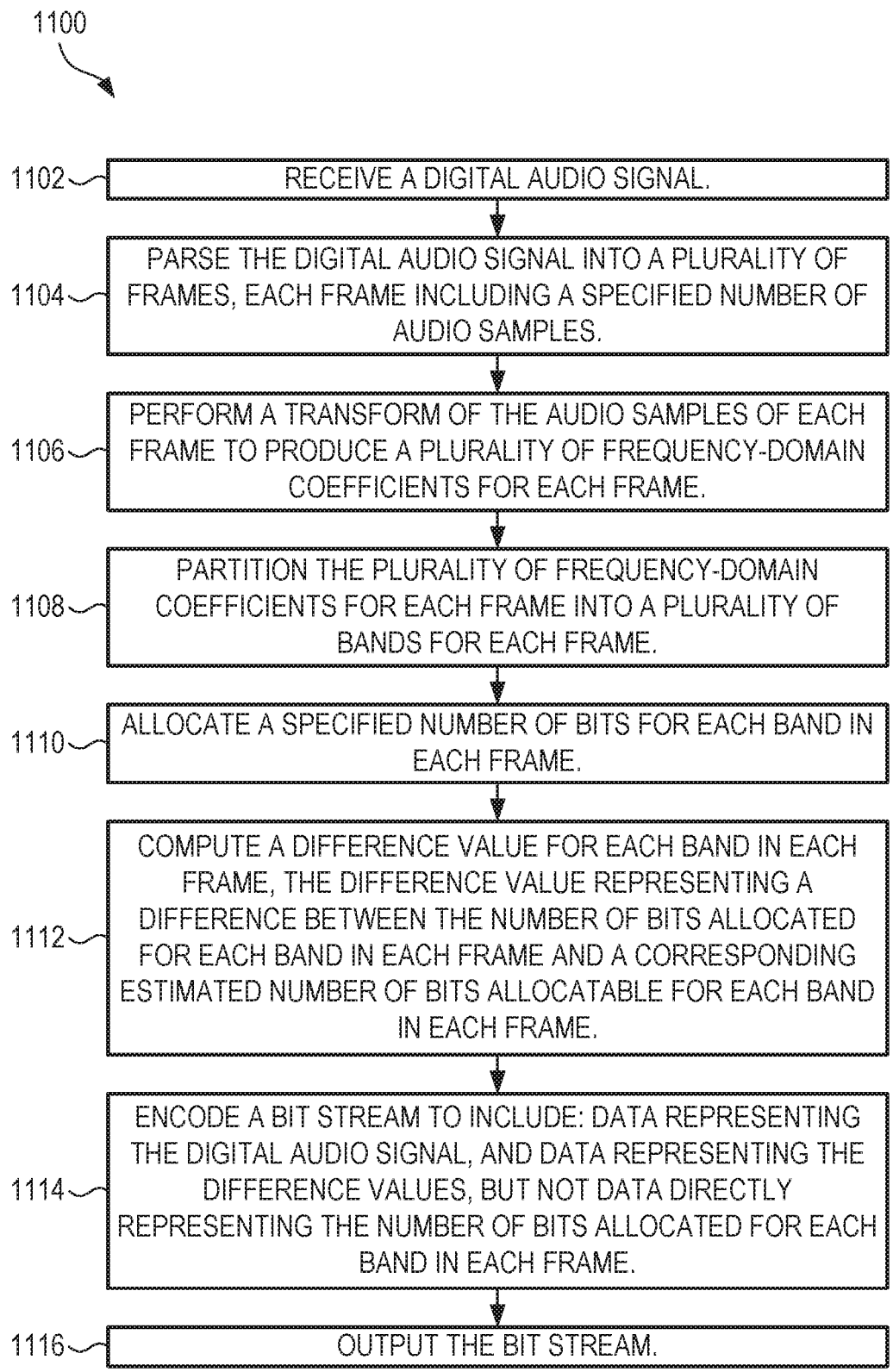
FIG. 11 shows a flowchart of an example of a method for encoding an audio signal, in accordance with some embodiments.

FIG. 11 shows a flowchart of an example of a method 1100 for encoding a bit stream (e.g., an audio signal), in accordance with some embodiments. The method 1100 can be executed by the encoding systems 100 or 200 of FIG. 1 or 2, or by any other suitable encoding system. The method 1100 is but one method for encoding an audio signal; other suitable encoding methods can also be used.

At operation 1102, the encoding system can receive a digital audio signal.

At operation 1104, the encoding system can parse the digital audio signal into a plurality of frames, each frame including a specified number of audio samples.

At operation 1106, the encoding system can perform a transform of the audio samples of each frame to produce a plurality of frequency-domain coefficients for each frame.

At operation 1108, the encoding system can partition the plurality of frequency-domain coefficients for each frame into a plurality of bands for each frame:

At operation 1110, the encoding system can allocate a specified number of bits for each band in each frame.

At operation 1112, the encoding system can compute a difference value for each band in each frame, the difference value representing a difference between the number of bits allocated for each band in each frame and a corresponding estimated number of bits allocatable for each band in each frame.

At operation 1114, the encoding system can encode a bit stream to include: data representing the digital audio signal, and data representing the difference values, but not data directly representing the number of bits allocated for each band in each frame.

At operation 1116, the encoding system can output the bit stream.

In some examples, the method 1100 can optionally further include computing a quantized norm of each band of each frame, each quantized norm having a value derived from frequency-domain coefficients in the band and quantized to equal one of a plurality of specified values; based on the quantized norms, determining the estimated number of bits allocatable for each band in each frame; and encoding data representing the quantized norms into the bit stream.

In some examples, the estimated number of bits allocated for each band in each frame can be determined based only on the quantized norms.

In some examples, the estimated number of bits allocated for each band in a particular frame can be determined based only on the quantized norms for the particular frame.

In some examples, the estimated number of bits allocated for each band in a particular frame can be determined based at least in part on quantized norms for at least one other frame in the digital audio signal.

In some examples, the method 1100 can optionally further include: determining at least one target parameter; determining the estimated number of bits allocatable for each band in each frame at least in part from the at least one target parameter; and encoding data representing the at least one target parameter into the bit stream.

In some examples, at least one target parameter can include a reference number of bits allocatable for each band. In some examples, the method 1100 can optionally further include: setting the estimated number of bits allocatable for each band to equal the reference number of bits allocatable for each band, for multiple frames in the digital audio signal; and encoding data representing the reference number of bits allocatable for each band into the bit stream.

In some examples, the at least one target parameter includes a slope.

In some examples, the transform is a modified discrete cosine transform.

In some examples, each frame includes exactly 1024 samples.

In some examples, a number of frequency-domain coefficients in each plurality of frequency-domain coefficients equals the specified number of audio samples in each frame.

In some examples, the plurality of frequency-domain coefficients for each frame includes exactly 1024 frequency-domain coefficients.

In some examples, the plurality of bands for each frame includes exactly 22 bands.

In some examples, the encoding system is included in a codec.

Each of the above examples can optionally be combined with one or number of the other examples, in any combination.

Figure 12:
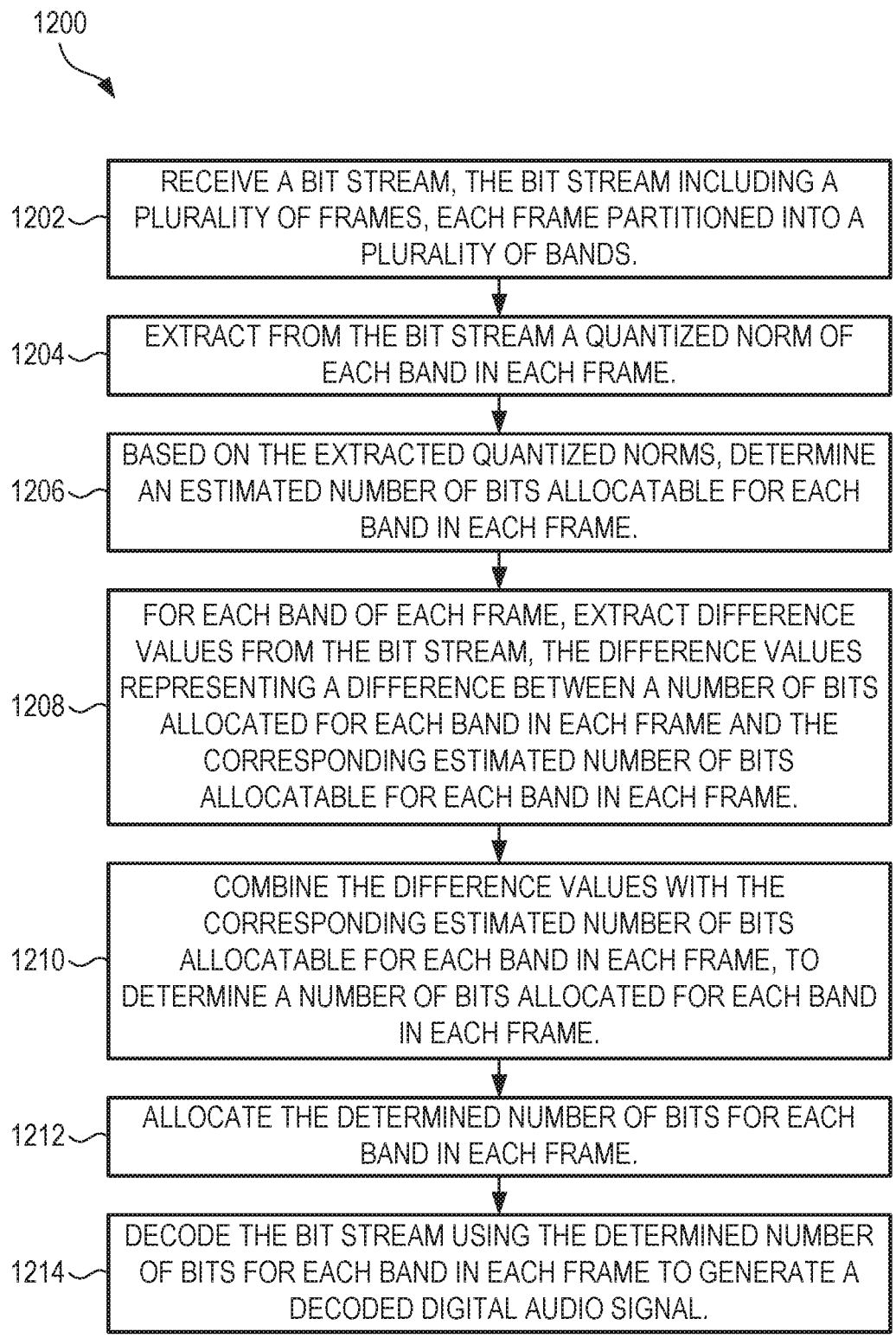
FIG. 12 shows a flowchart of an example of a method for decoding an encoded audio signal, in accordance with some embodiments.

FIG. 12 shows a flowchart of an example of a method 1200 for decoding a bit stream (e.g., an encoded audio signal), in accordance with some embodiments. The method 1200 can be executed by the decoding systems 300 or 400 of FIG. 3 or 4, or by any other suitable decoding system. The method 1200 is but one method for a bit stream (e.g., an encoded audio signal); other suitable decoding methods can also be used.

At operation 1202, the decoding system can receive a bit stream, the bit stream including a plurality of frames, each frame partitioned into a plurality of bands.

At operation 1204, the decoding system can extract from the bit stream a quantized norm of each band in each frame.

At operation 1206, the decoding system can, based on the extracted quantized norms, determine an estimated number of bits allocatable for each band in each frame.

At operation 1208, the decoding system can, for each band of each frame, extract difference values from the bit stream, the difference values representing a difference between a number of bits allocated for each band in each frame and the corresponding estimated number of bits allocatable for each band in each frame.

At operation 1210, the decoding system can combine the difference values with the corresponding estimated number of bits allocatable for each band in each frame, to determine a number of bits allocated for each band in each frame.

At operation 1212, the decoding system can allocate the determined number of bits for each band in each frame.

At operation 1214, the decoding system can decode the bit stream using the determined number of bits for each band in each frame to generate a decoded digital audio signal in the frequency domain. The decoding system can optionally further apply an inverse transform to the decoded digital audio signal in the frequency domain to obtain a decoded digital audio signal in the time domain.

In some examples, the estimated number of bits allocated for each band in each frame can be determined based only on the quantized norms.

In some examples, the estimated number of bits allocated for each band in a particular frame can be determined based only on the quantized norms for the particular frame.

In some examples, the estimated number of bits allocated for each band in a particular frame is determined based at least in part on quantized norms for at least one other frame in the digital audio signal.

Figure 13:
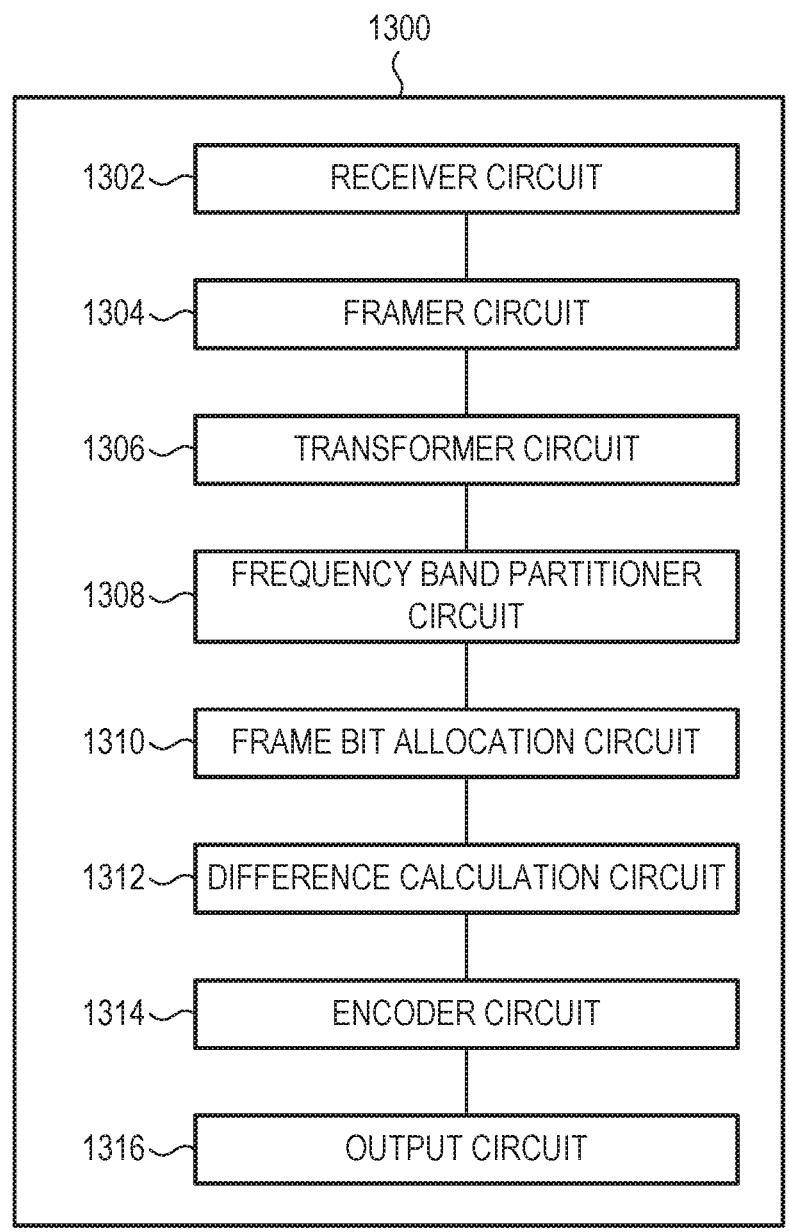
FIG. 13 shows a block diagram of an example of an encoding system, in accordance with some embodiments.

FIG. 13 shows a block diagram of an example of an encoding system 1300, in accordance with some embodiments.

A receiver circuit 1302 can receive a digital audio signal.

A framer circuit 1304 can parse the digital audio signal into a plurality of frames, each frame including a specified number of audio samples.

A transformer circuit 1306 can perform a transform of the audio samples of each frame to produce a plurality of frequency-domain coefficients for each frame.

A frequency band partitioner circuit 1308 can partition the plurality of frequency-domain coefficients for each frame into a plurality of bands for each frame.

A frame bit allocation circuit 1310 can allocate a specified number of bits for each band in each frame.

A difference calculation circuit 1312 can compute a difference value for each band in each frame, the difference value representing a difference between the number of bits allocated for each band in each frame and a corresponding estimated number of bits allocatable for each band in each frame.

An encoder circuit 1314 can encode a bit stream to include data representing the digital audio signal, and data representing the difference values, but not data directly representing the number of bits allocated for each band in each frame.

An output circuit 1316 can output the bit stream.

Many other variations than those described herein will be apparent from this document. For example, depending on the embodiment, certain acts, events, or functions of any of the methods and algorithms described herein can be performed in a different sequence, can be added, merged, or left out altogether (such that not all described acts or events are necessary for the practice of the methods and algorithms). Moreover, in certain embodiments, acts or events can be performed concurrently, such as through multi-threaded processing, interrupt processing, or multiple processors or processor cores or on other parallel architectures, rather than sequentially. In addition, different tasks or processes can be performed by different machines and computing systems that can function together.

The various illustrative logical blocks, modules, methods, and algorithm processes and sequences described in connection with the embodiments disclosed herein can be implemented as electronic hardware, computer software, or combinations of both. To clearly illustrate this interchangeability of hardware and software, various illustrative components, blocks, modules, and process actions have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of this document.

The various illustrative logical blocks and modules described in connection with the embodiments disclosed herein can be implemented or performed by a machine, such as a general purpose processor, a processing device, a computing device having one or more processing devices, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor and processing device can be a microprocessor, but in the alternative, the processor can be a controller, microcontroller, or state machine, combinations of the same, or the like. A processor can also be implemented as a combination of computing devices, such as a combination of a DSP and a microprocessor, a plurality of microprocessors, one or more microprocessors in conjunction with a DSP core, or any other such configuration.

Embodiments of the system and method described herein are operational within numerous types of general purpose or special purpose computing system environments or configurations. In general, a computing environment can include any type of computer system, including, but not limited to, a computer system based on one or more microprocessors, a mainframe computer, a digital signal processor, a portable computing device, a personal organizer, a device controller, a computational engine within an appliance, a mobile phone, a desktop computer, a mobile computer, a tablet computer, a smartphone, and appliances with an embedded computer, to name a few.

Such computing devices can typically be found in devices having at least some minimum computational capability, including, but not limited to, personal computers, server computers, hand-held computing devices, laptop or mobile computers, communications devices such as cell phones and PDAs, multiprocessor systems, microprocessor-based systems, set top boxes, programmable consumer electronics, network PCs, minicomputers, mainframe computers, audio or video media players, and so forth. In some embodiments the computing devices will include one or more processors. Each processor may be a specialized microprocessor, such as a digital signal processor (DSP), a very long instruction word (VLIW), or other microcontroller, or can be conventional central processing units (CPUs) having one or more processing cores, including specialized graphics processing unit (GPU)-based cores in a multi-core CPU.

The process actions of a method, process, or algorithm described in connection with the embodiments disclosed herein can be embodied directly in hardware, in a software module executed by a processor, or in any combination of the two. The software module can be contained in computer-readable media that can be accessed by a computing device. The computer-readable media includes both volatile and nonvolatile media that is either removable, non-removable, or some combination thereof. The computer-readable media is used to store information such as computer-readable or computer-executable instructions, data structures, program modules, or other data. By way of example, and not limitation, computer readable media may comprise computer storage media and communication media.

Computer storage media includes, but is not limited to, computer or machine readable media or storage devices such as Blu-ray discs (BD), digital versatile discs (DVDs), compact discs (CDs), floppy disks, tape drives, hard drives, optical drives, solid state memory devices, RAM memory, ROM memory, EPROM memory, EEPROM memory, flash memory or other memory technology, magnetic cassettes, magnetic tapes, magnetic disk storage, or other magnetic storage devices, or any other device which can be used to store the desired information and which can be accessed by one or more computing devices.

A software module can reside in the RAM memory, flash memory, ROM memory, EPROM memory, EEPROM memory, registers, hard disk, a removable disk, a CDROM, or any other form of non-transitory computer-readable storage medium, media, or physical computer storage known in the art. An exemplary storage medium can be coupled to the processor such that the processor can read information from, and write information to, the storage medium. In the alternative, the storage medium can be integral to the processor. The processor and the storage medium can reside in an application specific integrated circuit (ASIC). The ASIC can reside in a user terminal. Alternatively, the processor and the storage medium can reside as discrete components in a user terminal.

The phrase "non-transitory" as used in this document means "enduring or longlived". The phrase "non-transitory computer-readable media" includes any and all computer-readable media, with the sole exception of a transitory, propagating signal. This includes, by way of example and not limitation, non-transitory computer-readable media such as register memory, processor cache and random-access memory (RAM).

The phrase "audio signal" is a signal that is representative of a physical sound.

Retention of information such as computer-readable or computer-executable instructions, data structures, program modules, and so forth, can also be accomplished by using a variety of the communication media to encode one or more modulated data signals, electromagnetic waves (such as carrier waves), or other transport mechanisms or communications protocols, and includes any wired or wireless information delivery mechanism. In general, these communication media refer to a signal that has one or more of its characteristics set or changed in such a manner as to encode information or instructions in the signal. For example, communication media includes wired media such as a wired network or direct-wired connection carrying one or more modulated data signals, and wireless media such as acoustic, radio frequency (RF), infrared, laser, and other wireless media for transmitting, receiving, or both, one or more modulated data signals or electromagnetic waves. Combinations of the any of the above should also be included within the scope of communication media.

Further, one or any combination of software, programs, computer program products that embody some or all of the various embodiments of the encoding and decoding system and method described herein, or portions thereof, may be stored, received, transmitted, or read from any desired combination of computer or machine readable media or storage devices and communication media in the form of computer executable instructions or other data structures.

Embodiments of the system and method described herein may be further described in the general context of computer-executable instructions, such as program modules, being executed by a computing device. Generally, program modules include routines, programs, objects, components, data structures, and so forth, which perform particular tasks or implement particular abstract data types. The embodiments described herein may also be practiced in distributed computing environments where tasks are performed by one or more remote processing devices, or within a cloud of one or more devices, that are linked through one or more communications networks. In a distributed computing environment, program modules may be located in both local and remote computer storage media including media storage devices. Still further, the aforementioned instructions may be implemented, in part or in whole, as hardware logic circuits, which may or may not include a processor.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While the above detailed description has shown, described, and pointed out novel features as applied to various embodiments, it will be understood that various omissions, substitutions, and changes in the form and details of the devices or algorithms illustrated can be made without departing from the scope of the disclosure. As will be recognized, certain embodiments of the inventions described herein can be embodied within a form that does not provide all of the features and benefits set forth herein, as some features can be used or practiced separately from others.

Moreover, although the subject matter has been described in language specific to structural features and methodological acts, it is to be understood that the subject matter defined in the appended claims is not necessarily, limited to the specific features or acts described above. Rather, the specific features and acts described above are disclosed as example forms of implementing the claims.

What is claimed is:

1. An encoding system, comprising:
    a processor; and
    a memory device storing instructions executable by the processor, the instructions being executable by the processor to perform a method for encoding an audio signal, the method comprising:
        receiving a digital audio signal;
        parsing the digital audio signal into a plurality of frames, each frame including a specified number of audio samples;
        performing a transform of the audio samples of each frame to produce a plurality of frequency-domain coefficients for each frame;
        partitioning the plurality of frequency-domain coefficients for each frame into a plurality of bands for each frame;
        allocating a specified number of bits for each band in each frame;
        computing a difference value for each band in each frame, the difference value representing a difference between the number of bits allocated for each band in each frame and a corresponding estimated number of bits allocatable for each band in each frame;
        encoding a bit stream to include:
            data representing the digital audio signal, and
            data representing the difference values, but not data directly representing the number of bits allocated for each band in each frame; and
        outputting the bit stream.

2. The encoding system of claim 1, wherein the method further comprises:
    computing a quantized norm of each band of each frame, each quantized norm having a value derived from frequency-domain coefficients in the band and quantized to equal one of a plurality of specified values;
    based on the quantized norms, determining the estimated number of bits allocatable for each band in each frame; and
    encoding data representing the quantized norms into the bit stream.

3. The encoding system of claim 2, wherein the estimated number of bits allocated for each band in each frame is determined based only on the quantized norms.

4. The encoding system of claim 3, wherein the estimated number of bits allocated for each band in a particular frame is determined based only on the quantized norms for the particular frame.

5. The encoding system of claim 3, wherein the estimated number of bits allocated for each band in a particular frame is determined based at least in part on quantized norms for at least one other frame in the digital audio signal.

6. The encoding system of claim 1, wherein the method further comprises:
    determining at least one target parameter;
    determining the estimated number of bits allocatable for each band in each frame at least in part from the at least one target parameter; and
    encoding data representing the at least one target parameter into the bit stream.

7. The encoding system of claim 6,
    wherein the at least one target parameter includes a reference number of bits allocatable for each band; and
    the method further comprises:
        setting the estimated number of bits allocatable for each band to equal the reference number of bits allocatable for each band, for multiple frames in the digital audio signal; and
        encoding data representing the reference number of bits allocatable for each band into the bit stream.

8. The encoding system of claim 6, wherein the at least one target parameter includes a slope.

9. The encoding system of claim 1, wherein the transform is a modified discrete cosine transform.

10. The encoding system of 1, wherein each frame includes exactly 1024 samples.

11. The encoding system of claim 1, wherein a number of frequency-domain coefficients in each plurality of frequency-domain coefficients equals the specified number of audio samples in each frame.

12. The encoding system of claim 1, wherein the plurality of frequency-domain coefficients for each frame includes exactly 1024 frequency-domain coefficients.

13. The encoding system of claim 1, wherein the plurality of bands for each frame includes exactly 22 bands.

14. The encoding system of claim 1, wherein the encoding system is in a codec.

15. A decoding system, comprising:
    a processor; and
    a memory device storing instructions executable by the processor, the instructions being executable by the processor to perform a method for decoding an encoded audio signal, the method comprising:
        receiving a bit stream, the bit stream including a plurality of frames, each frame partitioned into a plurality of bands;
        extracting from the bit stream a quantized norm of each band in each frame;
        based on the extracted quantized norms, determining an estimated number of bits allocatable for each band in each frame;
        for each band of each frame, extracting difference values from the bit stream, the difference values representing a difference between a number of bits allocated for each band in each frame and the corresponding estimated number of bits allocatable for each band in each frame;

combining the difference values with the corresponding estimated number of bits allocatable for each band in each frame, to determine a number of bits allocated for each band in each frame;

allocating the determined number of bits for each band in each frame; and decoding the bit stream using the determined number of bits for each band in each frame to generate a decoded digital audio signal.

16. The decoding system of claim 15, wherein the estimated number of bits allocated for each band in each frame is determined based only on the quantized norms.

17. The decoding system of claim 15, wherein the estimated number of bits allocated for each band in a particular frame is determined based only on the quantized norms for the particular frame.

18. The decoding system of claim 15, wherein the estimated number of bits allocated for each band in a particular frame is determined based at least in part on quantized norms for at least one other frame in the digital audio signal.

19. An encoding system, comprising:
a receiver circuit to receive a digital audio signal;
a framer circuit to parse the digital audio signal into a plurality of frames, each frame including a specified number of audio samples;
a transformer circuit to perform a transform of the audio samples of each frame to produce a plurality of frequency-domain coefficients for each frame;
a frequency band partitioner circuit to partition the plurality of frequency-domain coefficients for each frame into a plurality of bands for each frame;
a frame bit allocation circuit to allocate a specified number of bits for each band in each frame;
a difference calculation circuit to compute a difference value for each band in each frame, the difference value representing a difference between the number of bits allocated for each band in each frame and a corresponding estimated number of bits allocatable for each band in each frame;
an encoder circuit to encode a bit stream to include:
data representing the digital audio signal, and
data representing the difference values, but not
data directly representing the number of bits allocated for each band in each frame; and
an output circuit to output the bit stream.

20. The encoding system of claim 19, wherein the estimated number of bits allocated for each band in a particular frame is determined based only on the quantized norms for the particular frame.

* * * * *